(12) United States Patent
Lin

(10) Patent No.: US 12,394,476 B2
(45) Date of Patent: Aug. 19, 2025

(54) IN-MEMORY COMPUTING (IMC) MEMORY DEVICE AND IN-MEMORY COMPUTING METHOD

(71) Applicant: MACRONIX INTERNATIONAL CO., LTD., Hsinchu (TW)

(72) Inventor: Yu-Yu Lin, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 133 days.

(21) Appl. No.: 18/504,254

(22) Filed: Nov. 8, 2023

(65) Prior Publication Data

US 2025/0149083 A1    May 8, 2025

(51) Int. Cl.
G11C 11/4096    (2006.01)
G11C 11/404    (2006.01)
G11C 11/4076    (2006.01)

(52) U.S. Cl.
CPC ...... G11C 11/4096 (2013.01); G11C 11/4045 (2013.01); G11C 11/4076 (2013.01)

(58) Field of Classification Search
CPC ............ G11C 11/4096; G11C 11/4045; G11C 11/4076

USPC .................................................. 365/189.011
See application file for complete search history.

(56) References Cited

U.S. PATENT DOCUMENTS 12,002,539 B2 *   6/2024   Chang .................... G06N 3/063
2024/0412784 A1 *  12/2024   Lin ....................... G11C 13/004

* cited by examiner

*Primary Examiner* — Connie C Yoha
(74) *Attorney, Agent, or Firm* — McClure, Qualey & Rodack, LLP (57) ABSTRACT

An in-memory computing (IMC) memory device comprises a plurality of computing memory cells and a plurality of balance computing memory cells forming a plurality of memory strings. In programming, a first resistance state number of the balance computing memory cells is determined based on a first resistance state number of the computing memory cells of the memory string. In IMC operations, when a read voltage is applied to the computing memory cells, the computing memory cells generate a plurality of cell currents which are summed into a plurality of memory string currents; the memory string currents charge a loading capacitor; a capacitor voltage of the loading capacitor is measured; and based a relationship between the capacitor voltage of the loading capacitor, at least one delay time and a predetermined voltage, an operation result of the input values and the weight values is determined.

13 Claims, 8 Drawing Sheets

IN-MEMORY COMPUTING (IMC) MEMORY DEVICE AND IN-MEMORY COMPUTING METHOD

TECHNICAL FIELD

The present disclosure relates to an in-memory computing (IMC) memory device and IMC method.

BACKGROUND

For the neural network calculation and applications, the vector-matrix multiplication (i.e. perceptron operation) is widely used. While implementing the neural network calculation in a computing-in-memory architecture, the weight values are stored in the memory array and the inputs are applied to the memory array for performing the perceptron calculation to reduce the power consumption and improve the efficiency.

Due to the memory array structure, the inputs for the perceptron operation or the vector-matrix multiplication are usually applied from the word line side and the bit line side, and the calculation results are read out by a sensing amplifier (SA). Thus, the number of the inputs is limited by the memory array size and the accumulated total current amplitude at the SA.

Since the number of the inputs is limited by the memory array size, there is an implementation to separate the inputs in to many input groups. The reading results from many input groups are sensed by several different SAs and then summed. The summation of the many reading results from different SAs might induce the reading error, and cost more time or/and energy consumption.

For the computing-in-memory architecture, there are two popular way to estimate the IMC result, i.e. the sum-of-current and sum-of-voltage approaches.

For the sum-of-current architecture, the summation current might be too large for a too large input number, and there needs to reduce the cell currents or a special design for the SA to handle the large current. However, the design is more complex.

For the sum-of-voltage architecture, the resistance of each computing memory cell should be low to have large sensing current and reduce the body effect.

Further, in the memory device, the weight value distribution of the memory strings might not be uniform, and that might degrade the linearity of the neural network calculation.

Thus, there needs an IMC memory device and an IMC method for improving the prior art disadvantages.

SUMMARY

According to one aspect of the disclosure, an IMC memory device is provided. The in-memory computing (IMC) memory device comprises: a memory control circuit; and a memory array coupled to the memory control circuit. The memory array includes: a plurality of computing memory cells and a plurality of balance computing memory cells forming a plurality of memory strings, the plurality of computing memory cells storing a plurality of weight values; a loading capacitor coupled to the plurality of computing memory cells; and a measurement circuit coupled to the loading capacitor. In programming, the memory control circuit determines a first resistance state number of the balance computing memory cells of the memory string based on a first resistance state number of the computing memory cells of the memory string. In IMC operations, a plurality of input voltages are input into the plurality of computing memory cells, the plurality of input voltages being corresponding to a plurality of input values, the memory control circuit sets the plurality of input values based on the plurality of input voltages; a plurality of balance input voltages are input into the plurality of balance computing memory cells, the plurality of balance input voltages being corresponding to a plurality of balance input values, the plurality of balance input voltages are enable input values, the memory control circuit sets the plurality of balance input values based on the plurality of balance input voltages; a plurality of effective resistances of the computing memory cells are corresponding to the input voltages and the weight values; when a read voltage is applied to the plurality of computing memory cells, the plurality of computing memory cells generate a plurality of cell currents, the plurality of cell currents are summed into a plurality of memory string currents; the plurality of memory string currents from the plurality of memory strings charge the loading capacitor; the measurement circuit measures a capacitor voltage of the loading capacitor; and based a relationship between the capacitor voltage of the loading capacitor, at least one delay time and a predetermined voltage, an operation result of the plurality of input values and the plurality of weight values is determined.

According to another aspect of the disclosure, provided is an in-memory computing (IMC) method applicable to an IMC memory device including a plurality of computing memory cells and a plurality of balance computing memory cells forming a plurality of memory strings. The IMC method comprises: in programming, determining a first resistance state number of the balance computing memory cells of the memory string based on a first resistance state number of the computing memory cells of the memory string; storing a plurality of weight values in a plurality of computing memory cells, the plurality of computing memory cells forming a plurality of memory strings; inputting a plurality of input voltages into the plurality of computing memory cells, the plurality of input voltages being corresponding to a plurality of input values, a plurality of effective resistances of the computing memory cells are corresponding to the input voltages and the weight values; inputting a plurality of balance input voltages into the plurality of balance computing memory cells, the plurality of balance input voltages being corresponding to a plurality of balance input values, the plurality of balance input voltages are enable input values, the plurality of balance input values being set based on the plurality of balance input voltages; when a read voltage is applied to the plurality of computing memory cells, generating a plurality of cell currents by the plurality of computing memory cells, the plurality of cell currents are summed into a plurality of memory string currents; charge the loading capacitor by the plurality of memory string currents from the plurality of memory strings; measuring a capacitor voltage of the loading capacitor; and based a relationship between the capacitor voltage of the loading capacitor, at least one delay time and a predetermined voltage, determining an operation result of the plurality of input values and the plurality of weight values.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

Figure 1:
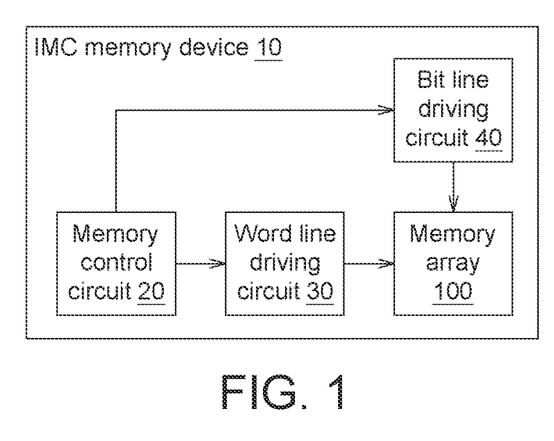
FIG. 1 shows a functional block diagram of an IMC (IN-MEMORY COMPUTING) memory device according to one embodiment of the application.

FIG. 1 shows a functional block diagram of an IMC (IN-MEMORY COMPUTING) memory device according to one embodiment of the application. The IMC memory device 10 according to one embodiment of the application includes a memory control circuit 20, a word line driving circuit 30, a bit line driving circuit 40 and a memory array 100. The memory control circuit 20 controls the word line driving circuit 30 and the bit line driving circuit 40 for outputting word line driving voltages and bit line driving voltages to the memory array 100. The operations and the structures of the memory control circuit 20, the word line driving circuit 30 and the bit line driving circuit 40 are not specified here.

Figure 2:
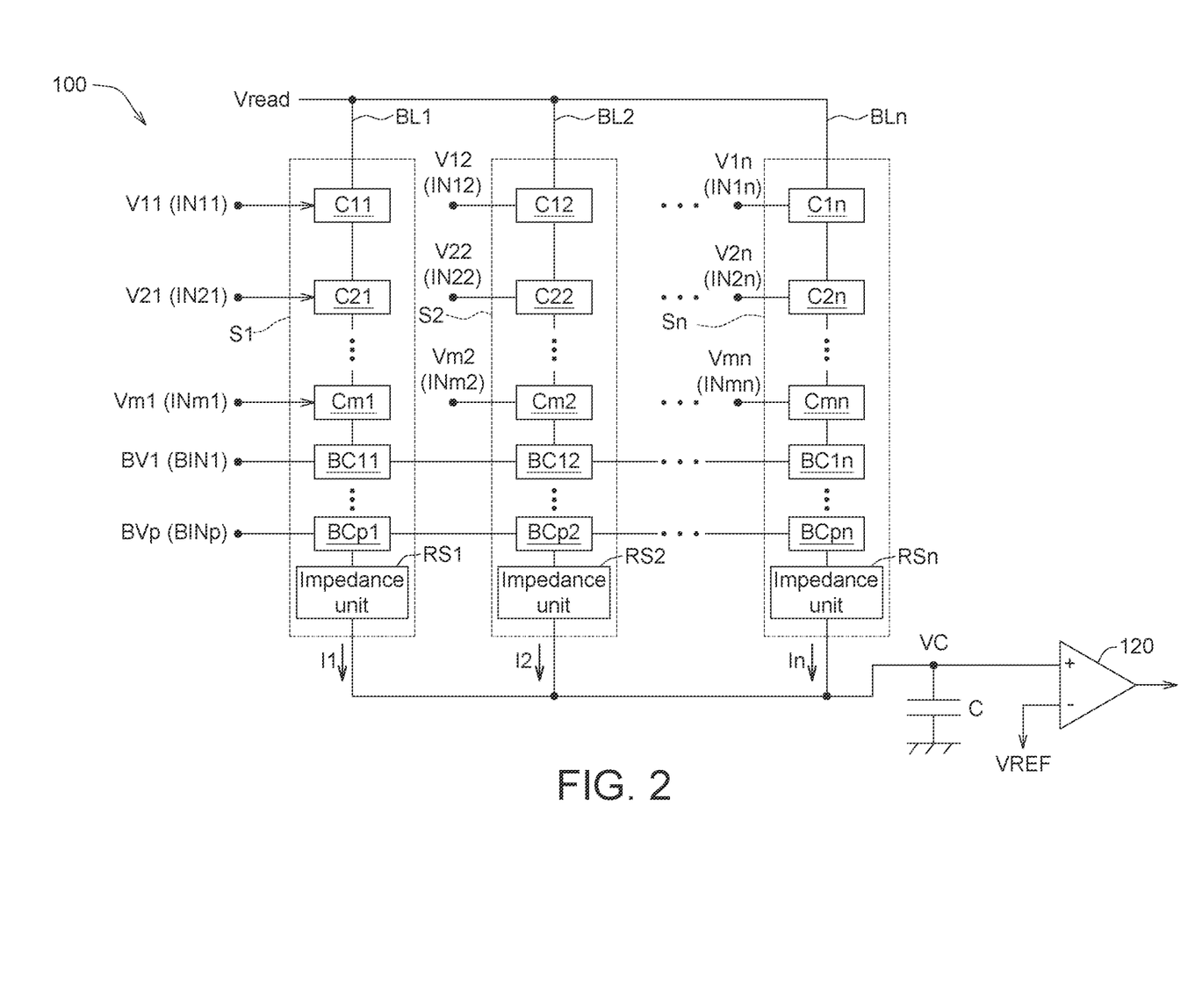
FIG. 2 is a schematic diagram of the memory array of the IMC memory device according to one embodiment of the application.

FIG. 2 is a schematic diagram of the memory array 100 of the IMC memory device according to one embodiment of the application. As shown in FIG. 2, the memory array 100 according to one embodiment of the application includes a plurality of computing memory cells C11-Cmn (m and n being positive integers), a plurality of balance computing memory cells BC11~BCpn (p being a positive integer), a plurality of resistance elements RS1~RSn, a loading capacitor C and a measurement circuit 120. The computing memory cells C11-Cmn and the balance computing memory cells BC11~BCpn are coupled to the loading capacitor C and the measurement circuit 120. In one possible example, the measurement circuit 120 may be implemented by a sensing amplifier (SA). The measurement circuit 120 compares a capacitor voltage VC of the loading capacitor C with a reference voltage VREF.

The computing memory cells C11-Cmn are disposed and arranged in n's vertical columns and m's horizontal rows to perform in-memory computing (IMC). The balance computing memory cells BC11~BCpn are disposed and arranged in n's vertical columns and p's horizontal rows to improve the performance of the IMC operations of the IMC memory device according to one embodiment of the application.

The computing memory cells and the balance computing memory cells in the same vertical column form a memory string. Thus, there are n memory strings S1~Sn. The memory strings S1 includes the computing memory cells C11, C21, . . . , Cm1, the balance computing memory cells BC11, . . . , BCp1 and the resistance element RS1. Others are so on.

The computing memory cells C11-Cmn receive the input voltages V11~Vmn, respectively. In details, the computing memory cells C11, C21, . . . , Cm1 receive the input voltages V11, V21, . . . , Vm1; the computing memory cells C12, C22, . . . , Cm2 receive the input voltages V12, V22, . . . , Vm2, respectively. The input voltages V11~Vmn are corresponding to a plurality of input values IN11~INmn. The memory control circuit 20 sets the input voltages V11~Vmn based on the input values IN11~INmn.

The computing memory cells C11-Cmn store a plurality of weight values W11Wmn.

The balance computing memory cells BC11~BCpn receive the balance input voltages BV1~BVp, respectively. In details, the balance computing memory cells BC11, BC12, . . . , BC1n receive the balance input voltage BV1; and others are so on. The balance input voltages BV1~BVp are corresponding to a plurality of balance input values BIN1~BINp. The memory control circuit 20 sets the balance input voltages BV1~BVp based on the balance input values BIN1~BINp. Further, in one embodiment of the present application, the balance computation memory cells BC11~BCpn electrically receive balance input voltages BV1-BVp, respectively. Although the balance computation memory cells BC11-BC1n electrically receive the same balance input voltage BV1, these balance computation memory cells BC11-BC1n do not need to be physically connected in series. These balance computation memory cells BC11-BC1n can also be located at different locations within the memory array 100, as long as these cells BC11-BC1n can electrically receive the same balance input voltage BV1. All of this falls within the scope of the present application.

The memory strings S1~Sn are parallel coupled. The memory string currents I1~In charge the loading capacitor C. The resistance elements RS1~RSn are optional.

In this embodiment, the computing memory cells C11-Cmn and the balance computing memory cells BC11-BCpn can be programmed to a high impedance state (or said a high resistance state) or a low impedance state (or said a low resistance state).

In this embodiment, during the programming phase, based on the IMC calculation to be executed by the IMC memory device 10 of this embodiment, the computing memory cells C11-Cmn of the memory strings S1-Sn are programmed (i.e., the computing memory cells C11-Cmn of the memory strings S1-Sn are programmed to a high impedance state or a low impedance state).

During the programming phase, the number of high impedance states of the balance computing memory cells BC11-BCpn is determined based on the number of high impedance states of the computing memory cells C11-Cmn within the same memory string S1-Sn. That is, during the programming phase, the memory control circuit 20 determines the number of high impedance states of the balance computing memory cells BC11-BCpn based on the number of high impedance states of the computing memory cells C11-Cmn within the same memory string S1-Sn.

To be more specific, taking p=3 as an example, but the application is not limited to this. For the memory string S1, when the number of high impedance states of the computing memory cells C11, C21, . . . , Cm1 is 0 (i.e., all these computing memory cells C11, C21, . . . , Cm1 are programmed to a low impedance state), the balance computing memory cells BC11, BC21, and BC31 are all programmed to a high impedance state, meaning the number of high impedance states for BC11, BC21, and BC31 is 3.

Similarly, for the memory string S1, when the number of high impedance states of the computing memory cells C11, C21, ..., Cm1 is 1, the number of high impedance states for the balance computing memory cells BC11, BC21, and BC31 is 2.

Similarly, for the memory string S1, when the number of high impedance states of the computing memory cells C11, C21, ..., Cm1 is 2, the number of high impedance states for the balance computing memory cells BC11, BC21, and BC31 is 1.

Similarly, for the memory string S1, when the number of high impedance states of the computing memory cells C11, C21, ..., Cm1 is 3 or more, the number of high impedance states for the balance computing memory cells BC11, BC21, and BC31 is 0.

Furthermore, during the IMC calculation, the balance input values BIN1-BlNp are set to bit 1 (enable bit) so that the resistance values of the balance computing memory cells BC11-BCpn can contribute to the memory strings.

Therefore, in this embodiment, when more balance computing memory cells are included within each memory string, during the programming phase, the number of high impedance states of the balance computing memory cells in each memory string can be determined as described above.

In other words, in this embodiment, within each memory string, when the number of high impedance states of the computing memory cells is fewer, the number of high impedance states of the balance computing memory cells will be more; and within each memory string, when the number of high impedance states of the computing memory cells is more, the number of high impedance states of the balance computing memory cells will be fewer. This can improve the fast charging behavior of the memory strings.

In one embodiment of the application, in performing IMC operations (for example but not limited by, multiply-and-accumulation (MAC) operations), when a read voltage Vread is applied to terminals of the computing memory cells C11-Cmn of the IMC memory device 10, the computing memory cells C11-Cmn may generate a plurality of cell currents. The cell currents generated by the computing memory cells of the same memory string are summed into the memory string current.

In one embodiment of the application, in IMC operations, the read voltage Vread is applied to terminals (for example but not limited by, drains) of the computing memory cells C11-Cmn of the IMC memory device 10, and the capacitor voltage VC of the loading capacitor C is measured to identify a charge time (or said, a delay time) during which the loading capacitor C is charged to a predetermined voltage. For simplicity, a timing when the read voltage Vread is applied is called a first timing; and a timing when the loading capacitor C is charged to the predetermined voltage is called a second timing. In one embodiment of the application, the delay time is defined as: from the first timing to the second timing. The capacitor voltage VC of the loading capacitor C is measured by the measurement circuit 120 to identify the delay time of the loading capacitor C.

In one embodiment of the application, the memory string resistance Ri (i=1~n) of the memory string Si (i=1~n) is expressed as:

$$R_i = \sum_{k=1\sim m} R_{ki}(IN_{ki}).$$

"i" refers the memory string index, "k" refers to the index of the computing memory cell in the memory string and there are m computing memory cells in one memory string.

Thus, the memory string current Ii of the memory string Si is expressed as:

$$I_i = V_{read} / \sum_{k=1\sim m} R_{ki}(IN_{ki}).$$

The weight values W11~Wmn of the computing memory cell are functions of the input values IN11~INmn and thus are expressed as the resistance function $Wki=R_{ki}(IN_{ki})$.

In one embodiment of the application, the charge time (or said, the delay time) during which the loading capacitor C is charged to the predetermined voltage is used to represent a sum of product of the weight values W11~Wmn of the computing memory cells C11~Cmn with the input values IN11~INmn. That is because, in one embodiment of the application, a sum of product of the weight values W11~Wmn of the computing memory cells C11~Cmn with the input values IN11~INmn is a total current Itotal. The total current Itotal may be represented as:

$$I_{Total} = \sum_{i=1\sim n} I_i = \sum_{i=1\sim n} V_{read} / \sum_{k=1\sim m} R_{ki}(IN_{ki}).$$

The total current Itotal charges the loading capacitor C and thus the timing when the capacitor voltage VC of the loading capacitor C is charged to the predetermined voltage is corresponding to the capacitance of the loading capacitor C and the total current Itotal. In one embodiment of the application, the capacitance of the loading capacitor C is given. Thus, in one embodiment of the application, the timing when the capacitor voltage VC of the loading capacitor C is charged to the predetermined voltage is in negative correlation with the total current Itotal. That is, when the total current Itotal is higher, the period during the capacitor voltage VC of the loading capacitor C is charged to the predetermined voltage is shorter; and when the total current Itotal is lower, the period during the capacitor voltage VC of the loading capacitor C is charged to the predetermined voltage is longer.

Thus, in one embodiment of the application, in given cases, the relationship between (1) the delay time at which the capacitor voltage VC of the loading capacitor C is charged to the predetermined voltage; and (2) the sum of product of the weight values W11~Wmn of the computing memory cells C11~Cmn with the input values IN11~INmn may be identified in advance. In the following IMC operations, the measured delay time is converted into the sum of product of the weight values W11~Wmn of the computing memory cells C11~Cmn with the input values IN11~INmn.

In one embodiment of the application, when the weight value of the computing memory cell and/or the input value are changed, the effective resistance of the computing memory cell is also changed. This results in different delay time (charge time).

Figure 3A:
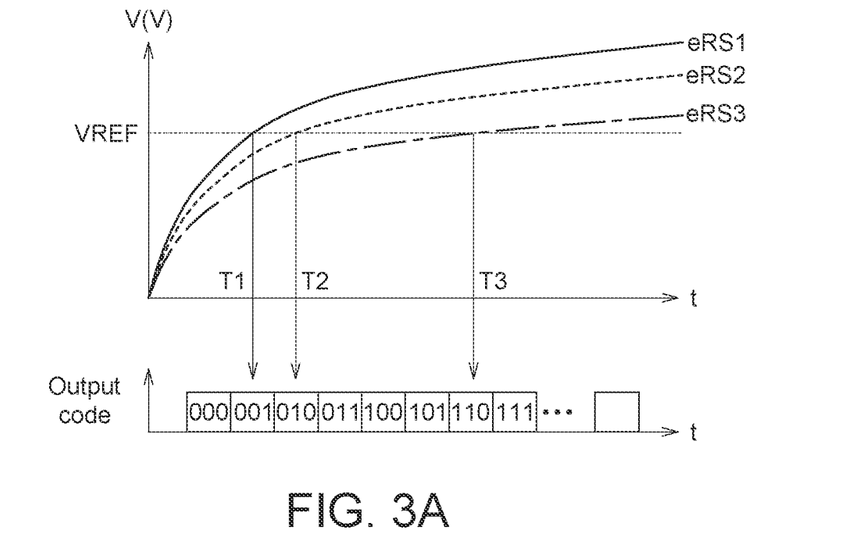
FIG. 3A and FIG. 3B shows measurements of delay time according to one embodiment of the application.
Figure 3B:
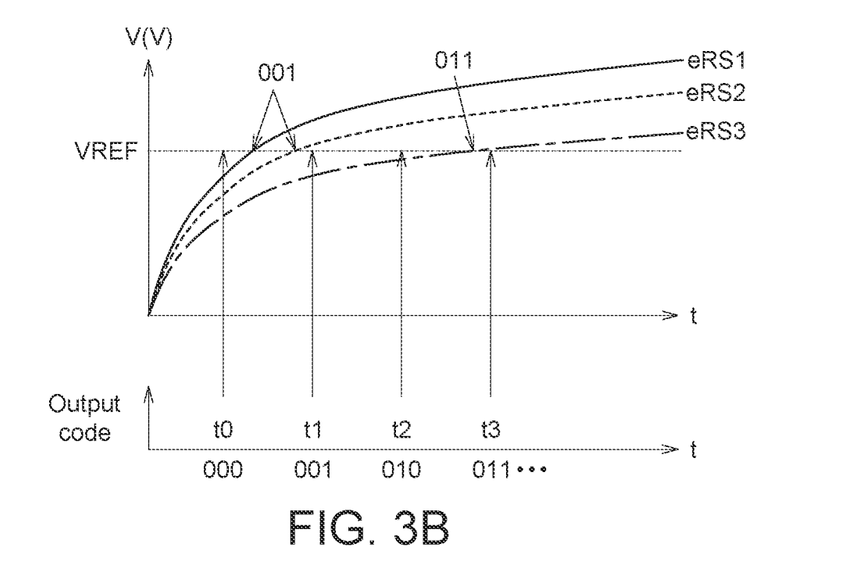

FIG. 3A and FIG. 3B shows measurements of delay time according to one embodiment of the application. In FIG. 3A and FIG. 3B, eRS1, eRS2 and eRS3 refer to different total effective resistance values of the S1~Sn, wherein eRS1<eRS2<eRS3.

In FIG. 3A, the delay time is defined as from a first timing when the read voltage is applied until a second timing when the capacitor voltage of the loading capacitor is charged to a predetermined voltage, the predetermined voltage is determined based on the read voltage Vread. For example but not limited by, the predetermined voltage is 0.7*Vread.

In FIG. 3A, when the total effective resistance values of the S1~Sn is eRS1, at the timing T1, the loading capacitor C is charged to the predetermined voltage. Thus, the delay time T1 indicates that the sum-of-product of the weight values W11~Wmn and the input values IN11~INmn is "001". Similarly, when the total effective resistance values of the S1~Sn is eRS2, at the timing T2, the loading capacitor C is charged to the predetermined voltage. Thus, the delay time T2 indicates that the sum-of-product of the weight values W11-Wmn and the input values IN11~INmn is "010". When the total effective resistance values of the S1~Sn is eRS3, at the timing T3, the loading capacitor C is charged to the predetermined voltage. Thus, the delay time T3 indicates that the sum-of-product of the weight values W11-Wmn and the input values IN11~INmn is "011". Others are so on.

Further, in another embodiment of the application, a plurality of predetermined delay times are selected. At the plurality of predetermined delay times, the capacitor voltage VC and the reference voltage VREF are compared and the comparison result indicates an operation result (for example, sum-of-product) of the input values and the weights values, as shown in FIG. 3B. That is, a plurality of predetermined delay times (t0~t3) are selected. At the plurality of predetermined delay times, whether the capacitor voltage VC reaches the predetermined voltage is checked, for determining the operation result (for example, sum-of-product) of the input values and the weights values. For example, at the delay time t0, if the capacitor voltage VC reaches the predetermined voltage, the operation result (for example, sum-of-product) of the input values and the weights values is determined as being 000; at the delay time t1, if the capacitor voltage VC reaches the predetermined voltage VREF, the operation result (for example, sum-of-product) of the input values and the weights values is determined as being 001; and others are so on.

In FIG. 3B, when the total effective resistance values of the S1~Sn is eRS1, at the timing t1, the capacitor voltage VC reaches the predetermined voltage, and the operation result (for example, sum-of-product) of the input values and the weights values is determined as 001. Similarly, when the total effective resistance values of the S1~Sn is eRS2, at the timing t1, the capacitor voltage VC reaches the predetermined voltage, and the operation result (for example, sum-of-product) of the input values and the weights values is determined as being 001. When the total effective resistance values of the S1~Sn is eRS3, at the timing t3, the capacitor voltage VC reaches the predetermined voltage, and the operation result (for example, sum-of-product) of the input values and the weights values is determined as being 011.

Now, the computing memory cells according to different embodiments of the application are described.

Figure 4A:
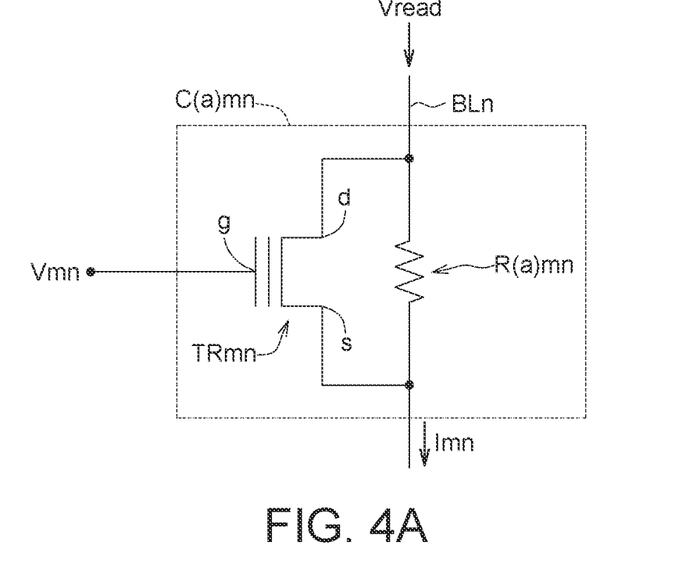
FIG. 4A is a circuit diagram of a computing memory cell of one embodiment of the application.

FIG. 4A is a circuit diagram of a computing memory cell C(a)mn of one embodiment of the application. The computing memory cell C(a)mn is used to realize the computing memory cells C11-Cmn and the balance computing memory cells BC11-BCpn of the memory array 100 in FIG. 2. The computing memory cell C(a)mn includes a transistor TRmn and a resistor R(a)mn. The transistor TRmn is coupled to the resistor R(a)mn in parallel, and the resistor R(a)mn has a fixed resistance value. The computing memory cell C(a)mn is coupled to the n-th bit line BLn. The drain d and the source s of the transistor TRmn are coupled to the bit line BLn, and the gate g of the transistor TRmn receives the input voltage Vmn. Resistor R(a)mn is also coupled to bit line BLn.

The transistor TRmn is, for example, a floating gate transistor The transistor TRmn has a threshold voltage Vt, and a programming voltage may be applied to adjust the voltage value of the threshold voltage Vt. When the transistor TRmn is in an erase state, the voltage value of the threshold voltage Vt is the first threshold voltage value VtL. When the transistor TRmn is in a programming state, the voltage value of the threshold voltage Vt may be programmed as the second threshold voltage value VtH. The second threshold voltage value VtH is greater than the first threshold voltage value VtL. The first threshold voltage value VtL is, for example, 0.4V, and the second threshold voltage value VtH is, for example, 4.8V. Furthermore, the threshold voltage Vt corresponds to the weight value Wmn stored in the computing memory cell C(a)mn. When the threshold voltage Vt is the first threshold voltage value VtL, it corresponds to the weight value Wmn of "0" stored in the computing memory cell C(a)mn. When the threshold voltage Vt is the second threshold voltage value VtH, the corresponding weight value Wmn stored in the computing memory cell C(a)mn is "1".

The gate g of the transistor TRmn may receive an input voltage Vmn. The input voltage Vmn corresponds to the input value INmn received by the computing memory cell C(a)mn. When the voltage value of the input voltage Vmn is the first input voltage value VL, the corresponding input value INmn is "1". When the voltage value of the input voltage Vmn is the second input voltage value VH, the corresponding input value INmn is "0". The second input voltage value VH is greater than the first input voltage value VL. The second input voltage value VH is, for example, 3V. The first input voltage value VL is, for example, 1V. Moreover, the second input voltage value VH is greater than the second threshold voltage value VtH and the first threshold voltage value VtL. Furthermore, the first input voltage value VL is lower than the second threshold voltage value VtH and greater than the first threshold voltage value VtL.

The computing memory cell C(a)mn may receive the read voltage Vread through the bit line BLn for generating the cell current Imn. In operation, in response to the input voltage Vmn and the threshold voltage Vt of different voltage values, the computing memory cell C(a)mn selectively generates the cell current. When the input voltage Vmn received by the computing memory cell C(a)mn is the second input voltage value VH, and the threshold voltage Vt of the transistor TRmn is the first threshold voltage value VtL or the second threshold voltage value VtH, since the input voltage Vmn is greater than the threshold voltage Vt, the transistor TRmn is in a turned-on (i.e., a conducting state). In this case, the computing memory cell C(a)mn generates the cell current Imn. The equivalent impedance of the computing memory cell C(a)mn is the equivalent resistance value Rtr of the transistor TRmn itself in parallel with the resistor R(a)mn. In one example, the resistance value of the resistor R(a)mn is much greater than the equivalent resistance value Rtr of the transistor TRmn, so the equivalent impedance of the computing memory cell C(a)mn is substantially equal to the equivalent resistance value Rtr of the transistor TRmn.

On the other hand, when the input voltage Vmn received by the computing memory cell C(a)mn is the first input voltage value VL, and the threshold voltage Vt of the transistor TRmn is the first threshold voltage value VtL, since the input voltage Vmn is greater than the threshold voltage Vt, the transistor TRmn is in the turned-on state and thus the computing memory cell C(a)mn generates the cell current Imn. In this condition, the equivalent impedance of the computing memory cell C(a)mn is substantially equal to the equivalent resistance value Rtr of the transistor TRmn.

Furthermore, when the input voltage Vmn received by the computing memory cell C(a)mn is the first input voltage value VL and the threshold voltage Vt of the transistor TRmn is the second threshold voltage value VtH, since the input voltage Vmn is lower than the threshold voltage Vt, therefore, the transistor TRmn is in a turned-off state (i.e., an open-circuit state) and thus the computing memory cell C(a)mn generates no cell current. In this situation, the equivalent impedance of the computing memory cell C(a)mn is substantially equal to the resistor R(a)mn.

According to the operation manner of the computing memory cell C(a)mn, Table 1 shows a truth table about whether the computing memory cell C(a)mn generates the cell current Imn, which is corresponding to the input value INmn and the weight value Wmn.

TABLE 1

| INmn | Wmn | |
|---|---|---|
| | 0 | 1 |
| 0 | generating the cell current Imn | generating the cell current Imn |
| 1 | generating the cell current Imn | generating no cell current Imn |

Referring to Table 1, when the input value INmn is "0" and the weight value Wmn is "0" or "1", the computing memory cell C(a)mn generates the cell current Imn. When the input value INmn is "1" and the weight value Wmn is "0" the computing memory cell C(a)mn generates the cell current Imn. When the input value INmn is "1" and the weight value Wmn is "1", the computing memory cell C(a)mn generates a small cell current Imn. Accordingly, the computing memory cell C(a)mn may perform a product operation of the input value INmn and the weight value Wmn, and the cell current Imn of the computing memory cell C(a)mn is equal to the product of the input value INmn and the weight value Wmn.

Figure 4B:
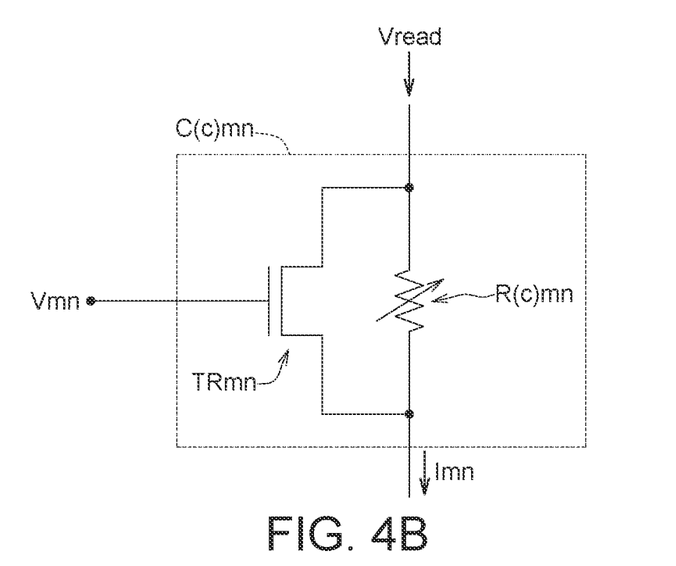
FIG. 4B is a circuit diagram of the computing memory cell according to one embodiment of the application.

FIG. 4B is a circuit diagram of the computing memory cell C(c)mn according to one embodiment of the application. The computing memory cell C(c)mn is used to realize the computing memory cells C11-Cmn and the balance computing memory cells BC11-BCpn of the memory array 100 in FIG. 2. Compared with the computing memory cell C(a)mn in FIG. 4A, the resistor R(c)mn of the computing memory cell C(c)mn in FIG. 4B is a variable resistor, which has a variable resistance value and may be dynamically adjusted during the operation of the memory device 10. In another example, resistor R(c)mn has a fixed resistance value, however, process parameters may be adjusted so as to adjust resistance value of resistor R(c)mn during fabrication. In FIG. 4B, the transistor TRmn is a general transistor.

The resistor R(c)mn may be adjusted as, for example, four resistance values R0, R1, R2 and R3. The resistance value R0 approaches zero, and the resistance value R0 is much smaller than the resistance values R1, R2 and R3. In addition, the equivalent resistance value Rtr of the transistor TRmn of the computing memory cell C(c)mn is also much smaller than the resistance values R1, R2 and R3.

When the weight value Wmn stored in the computing memory cell C(c)mn is "0", the resistor R(c)mn is adjusted as the resistance value R0. Similarly, when the weight value Wmn stored in the computing memory cell C(c)mn is "1", "2" and "3", the resistor R(c)mn is adjusted as the resistance values R1, R2 and R3.

When the input value INmn is "0", the input voltage Vmn is the second input voltage value VH of a high voltage value, the transistor TRmn is in the turned-on state, and the equivalent resistance of the computing memory cell C(c)mn is substantially equal to the equivalent resistance value Rtr of the transistor TRmn itself. In this case, regardless of whether the weight value Wmn is set to "0", "1", "2" or "3" (that is, regardless of whether the resistor R(c)mn is adjusted as the resistance value R0, R1, R2 or R3), the computing memory cell C(c)mn generates the cell current Imn.

On the other hand, when the input value INmn is "1", the input voltage Vmn is the first input voltage value VL of a low voltage value, the transistor TRmn is in the turned-off state, and the computing memory cell C(c)mn generates no cell current Imn. When the weight value Wmn is set as "0", "1", "2" and "3", the resistor R(c)mn is adjusted as the resistance values R0, R1, R2 and R3, and the cell current Imn generated from the computing memory cell C(c)mn is corresponding to the resistance values R0, R1, R2 and R3 respectively. Accordingly, the computing memory cell C(c)mn may perform a product operation, and the cell current Imn generated from the computing memory cell C(c)mn is equal to a product of the input value INmn and the weight value Wmn.

Figure 4C:
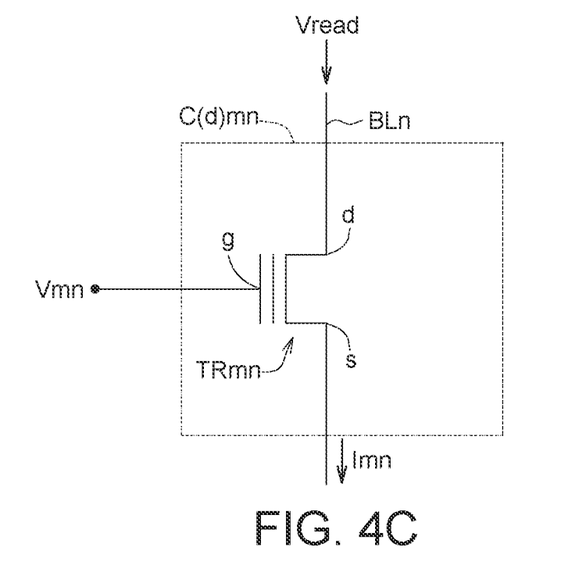
FIG. 4C is a circuit diagram of the computing memory cell according to one embodiment of the application.

FIG. 4C is a circuit diagram of the computing memory cell C(d)mn according to one embodiment of the application. The computing memory cell C(d)mn is used to realize the computing memory cells C11-Cmn and the balance computing memory cells BC11~BCpn of the memory array 100 in FIG. 2. Compared with the computing memory cell C(a)mn in FIG. 4A, the computing memory cell C(d)mn does not any resistor. In FIG. 4C, the computing memory cell C(d)mn has a weight value decided based on the threshold voltage of the transistor TRmn.

In other possible embodiments of the application, the computation memory cells C11-Cmn and the balance computation memory cells BC11-BCpn can have other possible implementation architectures, such as but not limited to, (1) the computation memory cells C11-Cmn and the balance computation memory cells BC11-BCpn can include multiplexers and multiple resistors; (2) the computation memory cells C11-Cmn and the balance computation memory cells BC11-BCpn can include multiple switch components and multiple resistors.

According to various embodiments of the application described above, the computing memory cell and the balance computation memory cell include one or more transistors and/or resistors. The threshold voltage of the transistor may be adjusted to change the weight value stored in the computing memory cell, and the resistor(s) may be adjusted to have a high resistance value, a low resistance value or resistance values with different ratios, according to the weight value. In addition, according to the input voltage corresponding to the input value, the computing memory cell is controlled to operate in the "ON state" or the "OFF state", hence the read voltage selectively applies to the transistor or the resistor, so that the computing memory cell generates a corresponding cell current to represent the output value. The output value represents a result of a product operation of the input value and the weight value, and may be summed-up to obtain a sum of the products. In addition, the computing memory cell may also include a multiplexer. Through the operation of the multiplexer, the read voltage selectively applies to the resistor on the selected path, so that the computing memory cell may perform a logic operation of the input value and the weight value, or perform a logic operation between two bits of the input values.

Figure 5A:
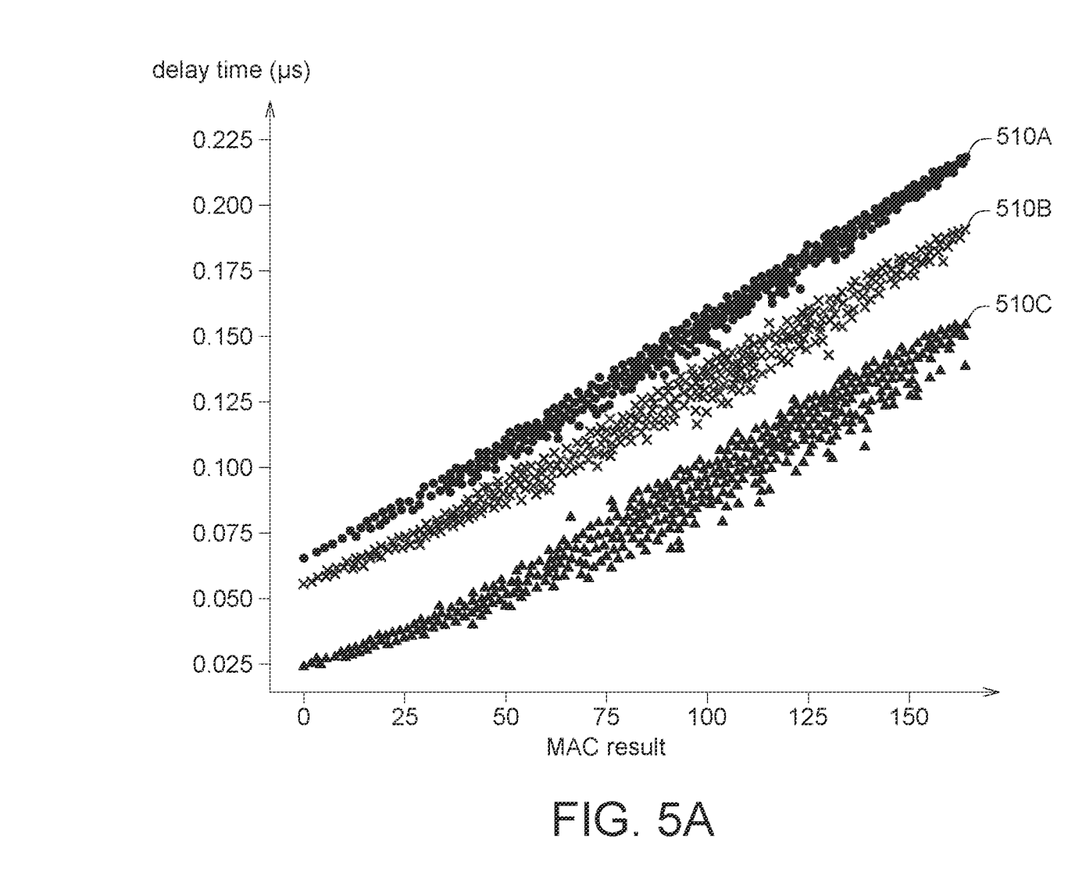
FIG. 5A to FIG. 5C show a simulation diagram according to one embodiment of the application.
Figure 5B:
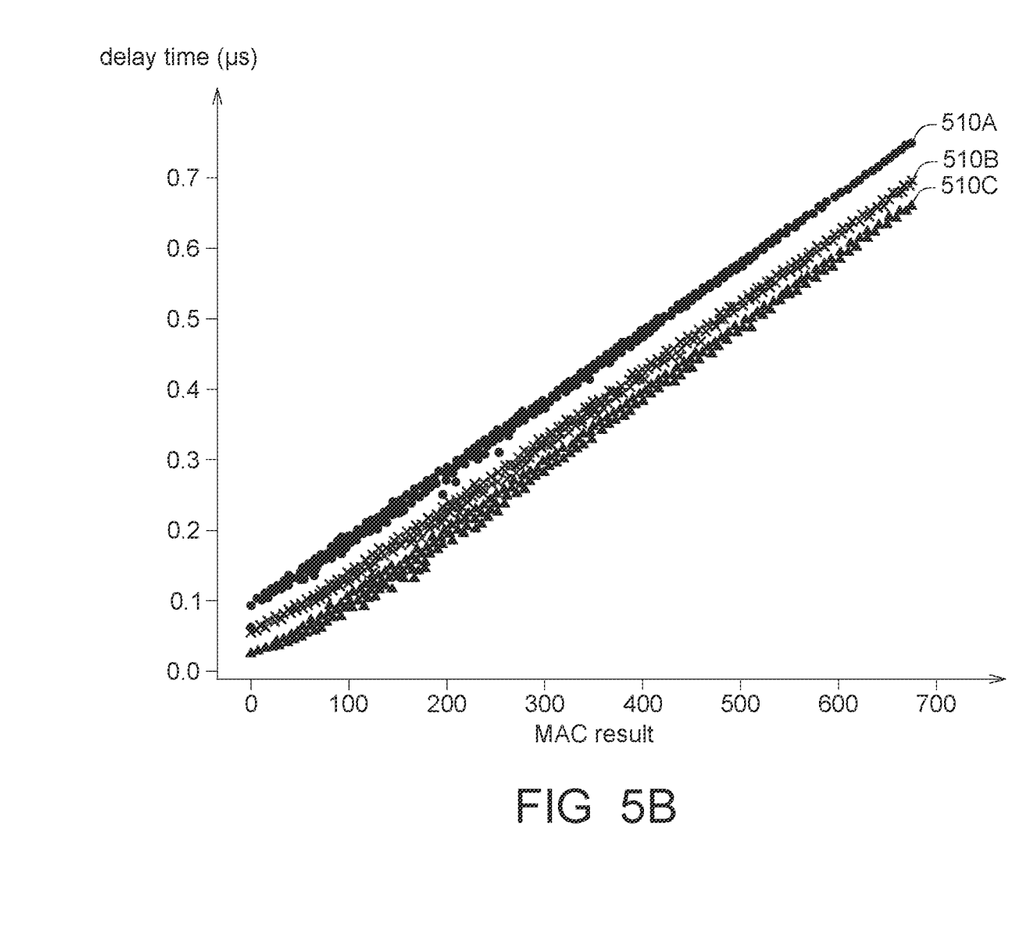
Figure 5C:
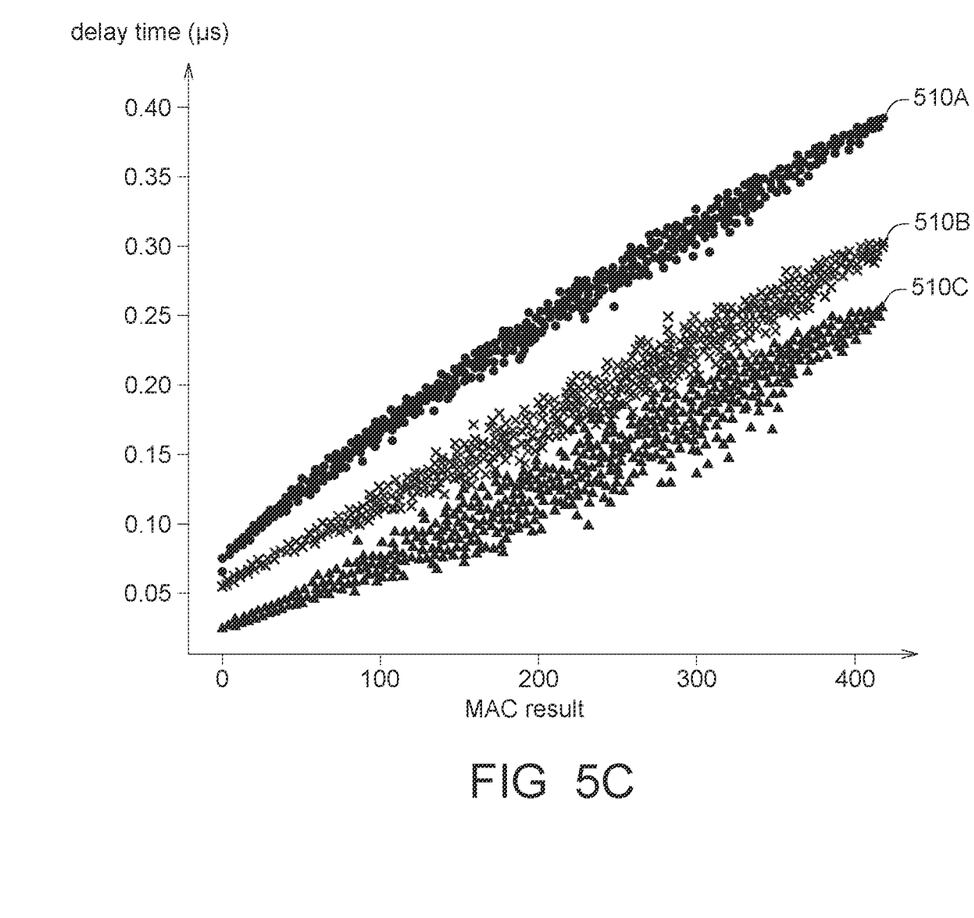

FIG. 5A to FIG. 5C show a simulation diagram according to one embodiment of the application. In FIG. 5A to FIG. 5C, the delay time and the sum-of-product results under the memory array including 32 memory strings (each memory string including 32 cascaded computing memory cells) are simulated respectively. The high resistance value of the computing memory cell and the balance computation memory cell is for example 555K ohm. The low resistance value of the computing memory cell and the balance computation memory cell is for example 13.5K ohm. The capacitance value CL of the loading capacitor C is 1.5 pF.

In one embodiment of the application, the capacitance value CL of the loading capacitor C is adjustable to adjust the delay time. In the following, the read voltage is 0.5V while the delay time is defined as the timing when the capacitor voltage VC of the loading capacitor C is charged to the predetermined voltage being 0.35V as an example, which is not to limit the application. The predetermined voltage is determined based on the read voltage. That is, when the capacitor voltage VC of the loading capacitor C is charged to 0.7 multiple of the read voltage, then the memory device 10 outputs the effective MAC operation results.

In FIG. 5A to FIG. 5C, the curve 510A indicates the simulation under the case that the resistance element has a high resistance and each memory string includes three balance computation memory cells; the curve 510B indicates the simulation under the case that the resistance element has a high resistance and each memory string does not include any balance computation memory cell; and the curve 510C indicates the simulation under the case that the each memory string includes neither any balance computation memory cell nor any resistance element.

In FIG. 5A, the number of high impedance states of the computing memory cells of the 32 memory strings are [6, 6, 1, 4, 6, 7, 3, 5, 5, 7, 3, 6, 6, 2, 7, 8, 7, 4, 7, 6, 3, 3, 2, 8, 4, 7, 4, 3, 7, 3, 9, 5], respectively.

In FIG. 5B, the number of high impedance states of the computing memory cells of the 32 memory strings are [24, 23, 22, 20, 22, 21, 17, 23, 21, 22, 20, 19, 20, 20, 23, 20, 22, 20, 20, 23, 21, 22, 18, 21, 24, 24, 18, 18, 22, 20, 24, 23], respectively.

In FIG. 5C, the number of high impedance states of the computing memory cells of the 32 memory strings are [7, 4, 7, 6, 3, 3, 2, 8, 4, 7, 4, 3, 7, 3, 9, 5, 24, 23, 22, 20, 22, 21, 17, 23, 21, 22, 20, 19, 20, 20, 23, 20], respectively.

From FIG. 5A to FIG. 5C, in one embodiment of the application, the delay time increase proportionally with the sum-of-product result. In this embodiment, the function of the balance computation memory cell is similar to an impedance component, which is used to limit current to avoid the fast charging effect.

Furthermore, in this embodiment, due to the introduction of the balance computation memory cell, when evaluating the IMC operation result (MAC result), it is necessary to compensate for the impact of the balance computation memory cells on the operation result, Taking the curve 510A (with balance computation memory cell) in FIG. 5C as an example, the MAC result of 400 corresponds to a delay time of 0.4 μs, and the MAC result of 0 corresponds to a delay time of 0.1 μs. Conversely, taking the curve 510C (without any balance computation memory cells) in FIG. 5C as an example, the MAC result of 400 corresponds to a delay time of 0.25 μs, and the MAC result of 0 corresponds to a delay time of 0.01 μs. To further illustrate, looking at the curve 510C (without any balance computation memory cells) in FIG. 5C, the original delay time of 0.12 μs corresponds to a MAC result of 200, but at the curve 510A (with balance computation memory cells) in FIG. 5C, the delay time of 0.25 μs corresponds to the MAC result of 200. Therefore, in this embodiment, when compensating for the impact of the balance computation memory cell on the operation result, the delay time is shifted back by approximately 0.13 μs to correspond to the MAC result.

In this embodiment, in the memory array, a part of the computation memory cells or many parts of the computation memory cells can be defined as balance computation memory cells. Moreover, each memory string includes the same number "NBW" of the balance computation memory cells and the same number "m" of the computation memory cells.

The current variation caused by adding an additional high impedance state unit (which can be the resistance element RS1~RSn or the balance computation memory cell) in the memory string will be [(1/m)−(1/(m+1))] compared with the case that there are no high impedance state units in the memory string. For example, in the following table,

| m | [(1/m) − (1/(m + 1))] |
|---|---|
| 2 | 16.7% |
| 3 | 8.3% |
| 4 | 5.0% |
| 5 | 3.3% |
| 6 | 2.4% |
| 7 | 1.8% |

For example, in each memory string, adding one high impedance state unit results in a current variation of 5%. Therefore, 4 high impedance state units need to be added to each memory string. In this embodiment, 3 balance computation memory cells and 1 resistance element can be allocated to each memory string.

Alternatively, if a smaller current variation is needed, such as a current variation of 2%, then 7 high impedance state units need to be added to each memory string. In this embodiment, 6 balance computation memory cells and 1 resistance element can be allocated to each memory string.

Furthermore, in this embodiment, considering linearity, accuracy, chip area usage, and other parameters, the number of balance computation memory cells can be further adjusted.

In this embodiment, for a given neural network model, the weight values and distribution are known and can be used to allocate the values of the balance computation memory cells. There are many methods to configure the values of the balance computation memory cells. For instance, if the minimum number of high impedance state memory cells in a memory string is "Nmin", all input values of the balance computation memory cells can be set to "1", and the number of high impedance units in this memory string can be increased to "Nmin+NBW" to further limit the current. Then, the values of the balance computation memory cells for other memory strings are allocated in this manner, making the minimum number of high impedance units in each memory string "Nmin+NBW".

Additionally, in this embodiment, "Nbw,Max" is defined to represent the number of balance computation memory cells with a value of "1" in the perceptron calculation. Balance computation memory cells may affect the charging time of perceptron operations. The more balance computation memory cells assigned a value of "1", the longer the charging time and the greater the sensing overhead.

Therefore, in this embodiment, the number of "Nbw, Max" is limited to reduce the sensing overhead. For example, to limit the sensing overhead to 10%, the estimated maximum perceptron output value can be calculated, and "Nbw,Max" can be defined as $\frac{1}{10}$ of the estimated maximum perceptron output value. If the estimated maximum perceptron output value is about 164, then "Nbw,Max" can be defined as 16. Alternatively, in this embodiment, "Nbw, Max" might be defined as roughly half of the total number of balance computation memory cells. This depends on the weight distribution.

In each memory string, the number of balance computation memory cells can be 1 or more than 1, and each memory string has the same number of balance computation memory cells.

The input values of the balance computation memory cells are set to "1" to enable their contribution to each memory string.

The position of the balance computation memory cells can be at the beginning, the end, or other positions within the memory string.

The impedance state of the balance computation memory cells depends on the weight value distribution of the memory array.

In the prior art, in performing IMC operations, the fast charging behavior may be occurred. The fast charging behavior refers to that, when all computing memory cells in the same memory string are all in low resistance states or when only few computing memory cells in the same memory string are in high resistance states, the same memory string has a low equivalent resistance, and thus the memory string generates a too high string current. The too high string current charges the loading capacitor C and thus the voltage level of the loading capacitor C is raised rapidly. Therefore, an error determination may be occurred.

Therefore, in one embodiment of the application, the balance computation memory cells and/or the resistance elements RS1-RSn are additionally formed in the memory strings S1~Sn to increase the equivalent resistance of the memory strings S1~Sn for effectively preventing or eliminating the fast charging behavior. Thus, even when all computing memory cells in the same memory string are all in low resistance states, due to the balance computation memory cells and/or the resistance elements RS1-RSn, the equivalent resistance of the same memory string is not too low and also the string current is not too high. Thus the voltage level of the loading capacitor C is raised not too rapidly. Therefore, an error determination may be prevented or eliminated.

In one embodiment of the application, the computing memory cells and the balance computation memory cells have at least two resistance states, i.e. high resistance state and low resistance state. When the computing memory cell is in the high resistance state (i.e. a first resistance state), the computing memory cell has a high resistance value RH (i.e. a first resistance value); and when the computing memory cell is in the low resistance state (i.e. a second resistance state), the computing memory cell has a low resistance value RL (i.e. a second resistance value).

In one embodiment of the application, the equivalent resistance RS of the resistance elements RS1-RSn are for example but not limited by, RS=2RL or RS=5RL, which may effectively prevent the fast charging behavior. Further, in one embodiment of the application, the equivalent resistance RS of the resistance elements RS1-RSn are for example but not limited by, RS=10RL or RS≥0.5*RH, which may effectively or totally eliminate the fast charging behavior.

Thus, in the embodiment of the application, the fast charging behavior is gradually prevented or eliminated and thus the error determination possibility is reduced.

In one embodiment of the application, each of the resistance elements RS1-RSn is a resistor made by process. Alternatively, in one embodiment of the application, each of the resistance elements RS1-RSn is a transistor. Alternatively, in one embodiment of the application, each of the resistance elements RS1-RSn is a combination of a transistor and a resistor, wherein for the programming operations or the computing memory cell weight adjustment process, the transistor is bypass; and for the sensing operations, the transistor is turned off.

In one embodiment of the application, the power consumption of the IMC operations in the IMC memory device can be adjusted to a reasonable sensing range by tuning the loading capacity value of the loading capacitor For a certain number of the computing memory cells and a certain number of the input values, by carefully arranging the number of the memory strings and the number of the computing memory in a single memory string, the power consumption is reduced.

In one embodiment of the application, the computing memory cell number on one memory string can be any larger than 2 (including 2); and the memory array may include any number of the memory strings. Further, the resistance of the computing memory cells may be changed by the input value.

The read voltage is lower than 1V which is compatible to the operation scheme of NAND flash memory device.

In one embodiment of the application, the memory device 10 may be used in for example but not limited by, neural network calculation, the sum-of-product calculation, comparison of input data with stored data in the memory array and the like.

In other possible embodiment of the application, the computing memory cells and the balance computing memory cells may have three or more resistance states (i.e. three or more resistance values), which is still within the spirit and the scope of the application.

In one embodiment of the application, the IMC operation is not performed under the sum-of-voltage architecture, and thus more input values are concurrently calculated. Also, a single amplifier meets the requirements of IMC operations. Therefore, one embodiment of the application has advantages of lowering reading errors and power consumption.

The IMC memory device of one embodiment of the application is the mixed mode of the sum-of-current architecture and the sum-of-voltage architecture and thus more input values are concurrently calculated. Further, the large summed current problem raised by the sum-of-current architecture is prevented and also the low sensing current problem raised by the sum-of-voltage architecture is also prevented.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. An in-memory computing (IMC) memory device, comprising:
a memory control circuit; and
a memory array coupled to the memory control circuit, the memory array including:
a plurality of computing memory cells and a plurality of balance computing memory cells forming a plurality of memory strings, the plurality of computing memory cells storing a plurality of weight values;
a loading capacitor coupled to the plurality of computing memory cells; and
a measurement circuit coupled to the loading capacitor,
wherein in programming, the memory control circuit determines a first resistance state number of the balance computing memory cells of the memory string based on a first resistance state number of the computing memory cells of the memory string;
wherein in IMC operations,
a plurality of input voltages are input into the plurality of computing memory cells, the plurality of input voltages being corresponding to a plurality of input values, the memory control circuit sets the plurality of input values based on the plurality of input voltages,
a plurality of balance input voltages are input into the plurality of balance computing memory cells, the plurality of balance input voltages being corresponding to a plurality of balance input values, the plurality of balance input voltages are enable input values, the memory control circuit sets the plurality of balance input values based on the plurality of balance input voltages,
a plurality of effective resistances of the computing memory cells are corresponding to the input voltages and the weight values,
when a read voltage is applied to the plurality of computing memory cells, the plurality of computing memory cells generate a plurality of cell currents, the plurality of cell currents are summed into a plurality of memory string currents,
the plurality of memory string currents from the plurality of memory strings charge the loading capacitor,
the measurement circuit measures a capacitor voltage of the loading capacitor, and
based a relationship between the capacitor voltage of the loading capacitor, at least one delay time and a predetermined voltage, an operation result of the plurality of input values and the plurality of weight values is determined.

2. The IMC memory device according to claim 1, wherein
the plurality of computing memory cells and the plurality of balance computing memory cells have a first resistance value and a second resistance value lower than the first resistance value,
the first resistance state number of the computing memory cells indicates a number of the computing memory cells programmed as having the first resistance value, and
the first resistance state number of the balance computing memory cells indicates a number of the balance computing memory cells programmed as having the first resistance value,
each of the plurality of memory strings including at least two cascaded memory cells, the plurality of memory strings being coupled in parallel, and
the delay time is defined as from a first timing when the read voltage is applied until a second timing when the capacitor voltage of the loading capacitor is charged to the predetermined voltage, the predetermined voltage is determined based on the read voltage.

3. The IMC memory device according to claim 1, wherein at a plurality of predetermined delay times, whether the capacitor voltage reaches the predetermined voltage is checked to generate a comparison result, the comparison result indicating the operation result of the input values and the weight values.

4. The IMC memory device according to claim 1, further including: a plurality of resistance elements included in the memory strings, the plurality of resistance elements being serially coupled to the plurality of computing memory cells and the plurality of balance computing memory cells.

5. The IMC memory device according to claim 4, wherein
the plurality of computing memory cells and the plurality of balance computing memory cells have a first resistance value and a second resistance value lower than the first resistance value; and
an equivalent resistance of the plurality of resistance elements is equivalent to or higher than double of the second resistance value, or the equivalent resistance of the plurality of resistance elements is equivalent to or higher than a half of the first resistance value.

6. The IMC memory device according to claim 1, wherein
in the memory strings, a number of the plurality of balance computing memory cells is one or more than one,
the memory strings have the same number of the plurality of balance computing memory cells, and
in the memory strings, the balance computation memory cells are allocated at a beginning, an end, or other positions within the memory strings.

7. The IMC memory device according to claim 1, wherein the computing memory cells and the balance computing memory cells have three or more resistance states.

8. An in-memory computing (IMC) method applicable to an IMC memory device including a plurality of computing memory cells and a plurality of balance computing memory cells forming a plurality of memory strings, the IMC method comprising:
in programming, determining a first resistance state number of the balance computing memory cells of the memory string based on a first resistance state number of the computing memory cells of the memory string,
storing a plurality of weight values in a plurality of computing memory cells, the plurality of computing memory cells forming a plurality of memory strings;
inputting a plurality of input voltages into the plurality of computing memory cells, the plurality of input voltages being corresponding to a plurality of input values, a plurality of effective resistances of the computing memory cells are corresponding to the input voltages and the weight values;
inputting a plurality of balance input voltages into the plurality of balance computing memory cells, the plurality of balance input voltages being corresponding to a plurality of balance input values, the plurality of balance input voltages are enable input values, the plurality of balance input values being set based on the plurality of balance input voltages;
when a read voltage is applied to the plurality of computing memory cells, generating a plurality of cell currents by the plurality of computing memory cells, the plurality of cell currents are summed into a plurality of memory string currents;
charge the loading capacitor by the plurality of memory string currents from the plurality of memory strings;

measuring a capacitor voltage of the loading capacitor; and based a relationship between the capacitor voltage of the loading capacitor, at least one delay time and a predetermined voltage, determining an operation result of the plurality of input values and the plurality of weight values.

9. The IMC method according to claim 8, wherein the plurality of computing memory cells and the plurality of balance computing memory cells have a first resistance value and a second impedance value lower than the first resistance value, the first resistance state number of the computing memory cells indicates a number of the computing memory cells programmed as having the first resistance value, and the first resistance state number of the balance computing memory cells indicates a number of the balance computing memory cells programmed as having the first resistance value, the delay time is defined as from a first timing when the read voltage is applied until a second timing when the capacitor voltage of the loading capacitor is charged to the predetermined voltage, the predetermined voltage is determined based on the read voltage.

10. The IMC method according to claim 8, wherein at a plurality of predetermined delay times, whether the capacitor voltage reaches the predetermined voltage is checked to generate a comparison result, the comparison result indicating the operation result of the input values and the weight values.

11. The IMC method according to claim 8, wherein:

the IMC memory device further includes a plurality of resistance elements included in the memory strings, the plurality of resistance elements being serially coupled to the plurality of computing memory cells and the plurality of balance computing memory cells;

the plurality of computing memory cells and the plurality of balance computing memory cells have a first resistance value and a second resistance value lower than the first resistance value; and an equivalent resistance of the plurality of resistance elements is equivalent to or higher than double of the second resistance value, or the equivalent resistance of the plurality of resistance elements is equivalent to or higher than a half of the first resistance value.

12. The IMC method according to claim 8, wherein in the memory strings, a number of the plurality of balance computing memory cells is one or more than one, the memory strings have the same number of the plurality of balance computing memory cells, and in the memory strings, the balance computation memory cells are allocated at a beginning, an end, or other positions within the memory strings.

13. The IMC method according to claim 8, wherein the computing memory cells and the balance computing memory cells have three or more resistance states.

* * * * *